United States Patent
Khosropour

[11] Patent Number: 6,162,651
[45] Date of Patent: Dec. 19, 2000

[54] METHOD AND SYSTEM FOR ACCURATELY MARKING THE BACKSIDE OF THE DIE FOR FAULT LOCATION ISOLATION

[75] Inventor: Fred Khosropour, San Jose, Calif.

[73] Assignee: Advanced Micro Devices, Inc., Sunnyvale, Calif.

[21] Appl. No.: 09/153,758

[22] Filed: Sep. 15, 1998

[51] Int. Cl.[7] .................................................. H01L 21/00
[52] U.S. Cl. ................................. 438/15; 438/4; 438/940
[58] Field of Search .................................. 438/14, 15, 16, 438/17, 18, 4, 940; 29/593; 257/48

[56] References Cited

U.S. PATENT DOCUMENTS

| | | | |
|---|---|---|---|
| 5,807,763 | 9/1998 | Motika et al. | 438/18 |
| 5,821,549 | 10/1998 | Talbot et al. | 250/307 |
| 5,834,323 | 11/1998 | Ghafghaichi et al. | 438/17 |
| 5,904,489 | 5/1999 | Khosropour et al. | 438/15 |
| 5,972,723 | 10/1999 | Bartley et al. | 438/4 |

*Primary Examiner*—Donald L. Monin, Jr.
*Assistant Examiner*—Michael Dietrich
*Attorney, Agent, or Firm*—Sawyer Law Group LLP

[57] ABSTRACT

A system and method for deprocessing a semiconductor die is disclosed. The semiconductor dies has an active area and at least one feature in the active area. The method and system include tuning an ablation laser. The method and system further include ablating a first portion of the semiconductor die using a tuned ablation laser to mark a location of the feature. The first portion is distinct from the active area and has a center. The center of the first portion is substantially above the feature. The method and system also include deprocessing a second portion of the semiconductor die using the first portion as a guide.

16 Claims, 5 Drawing Sheets

METHOD AND SYSTEM FOR ACCURATELY MARKING THE BACKSIDE OF THE DIE FOR FAULT LOCATION ISOLATION

FIELD OF THE INVENTION

The present invention relates to investigating faults in a semiconductor device and more particularly to a method and system for more accurately marking a location of a fault, particularly on the back side of a flip-chip semiconductor device.

BACKGROUND OF THE INVENTION

Flip-chip devices are typically composed of a semiconductor device, or die, mounted on a substrate. Near the top of the semiconductor die, circuits are formed in an active area. The remaining part of the semiconductor die is an inactive area. In order to make electrical connection between the circuit on the semiconductor die and the substrate, the semiconductor die is flipped. Thus, the active area is in proximity to the substrate. This is in contrast to conventional semiconductor devices, which mount the inactive portion of the semiconductor die to a substrate.

After fabrication of the flip-chip device, it is often desirable to detect features, such as faults, within the semiconductor die or investigate other features within the circuit. In order to do so, the inactive area is thinned from the back side of the die. Thus, a surface within the inactive area is exposed. This surface will also be referred to as the back side. An infrared microscope or other mechanism may be used to image faults in the semiconductor die. Once the location of the fault is determined, the semiconductor die around the fault may be deprocessed in order to determine the exact nature of the fault.

Deprocessing the semiconductor die typically includes milling away a portion of inactive area. In order to mill a portion of the semiconductor die, the die is typically removed from the infrared microscope and placed in a mill. Typically, the diameter of the ion beam used to mill a portion of the semiconductor is much larger than the size of the fault detected and much smaller than the die itself. Thus, the desired milling location is determined.

Typically, the desired milling location is determined based on an attribute on the back side of the semiconductor die. The conventional method for deprocessing commences by choosing a particular attribute on the back side of the semiconductor die. Alternatively, the conventoinal method may commence by creating an attribute at the edge of the back side of the die, for example using a laser. When imaging the fault in the infrared microscope, a user determines the location of the fault with respect to the attribute. When the semiconductor die is moved to the mill, the user utilizes the knowledge of the location of the fault with respect to the attribute to navigate from the attribute to the fault. The user then mills in the area of the fault.

Although the conventional method allows a user to deprocess a portion of the semiconductor die, the conventional method is time consuming and subject to error. The size of the attribute on the back side of the die is typically large in comparison to the fault size. When navigating from the attribute to the fault in the mill, errors may be made. The center of the portion of the semiconductor die being milled may be away from the location of the fault. As a result, when the portion is milled, the fault may not be exposed. The user then must perform milling in a new location believed to be closer to the fault. This milling is extremely time consuming and tedious. In addition, the process of navigating from the attribute to the fault is also time consuming. Thus, deprocessing is made more difficult.

Accordingly, what is needed is a system and method for more accurately marking the location of the fault in a semiconductor die. The present invention addresses such a need.

SUMMARY OF THE INVENTION

The present invention provides a system and method for deprocessing a semiconductor die. The semiconductor dies has an active area and at least one feature in the active area. The method and system comprise tuning an ablation laser. The method and system further comprise ablating a first portion of the semiconductor die using a tuned ablation laser to mark a location of the feature. The first portion is distinct from the active area and has a center. The center of the first portion is substantially above the feature. The method and system also comprise deprocessing a second portion of the semiconductor die using the first portion as a guide.

According to the system and method disclosed herein, the present invention allows the semiconductor die to be deprocessed more accurately and rapidly, thereby increasing overall system performance.

DETAILED DESCRIPTION OF THE INVENTION

The present invention relates to an improvement in investigation of characteristics of a semiconductor die. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
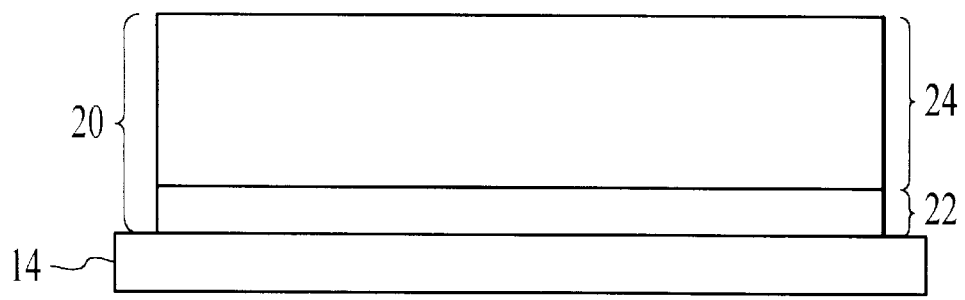
FIG. 1 is a block diagram depicting a side view of a semiconductor die.

FIG. 1 is a block diagram of a flip-chip device 10. The flip-chip device 10 includes a semiconductor die 20 mounted to a substrate 14. The semiconductor die 20 includes an active area 22 and an inactive area 24. The active area 22 is usually on the order of eighty to one hundred microns thick and includes circuitry formed in the die. The inactive area 24 is typically several hundred microns thick. In the flip-chip device 10, the active area 22, instead of the back side of the semiconductor die 20, is mounted to the substrate 14.

Figure 2A:
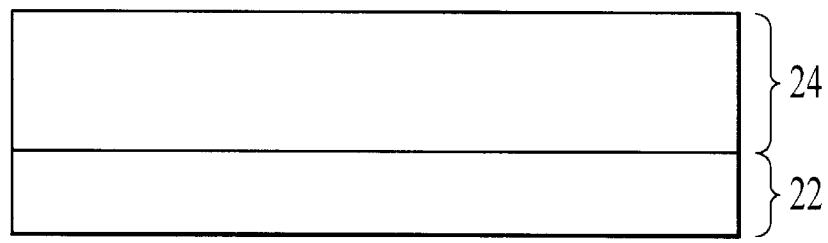
FIG. 2A is a block diagram depicting a side view of a semiconductor die that has been thinned.

In order to find faults in the semiconductor die, the semiconductor die is typically deprocessed. The inactive area 24 is first thinned. FIG. 2A depicts the semiconductor die 20 after thinning. For the purposes of clarity, in FIG. 2A and subsequent figures only the die 20 is shown. The thinning of the inactive area 24 is typically not well controlled. Consequently, the inactive remaining inactive area 24 is on the order of one hundred to one hundred and fifty microns thick. During deprocessing, a surface 25, also called the back side, within the inactive area 24 is exposed.

Figure 2B:
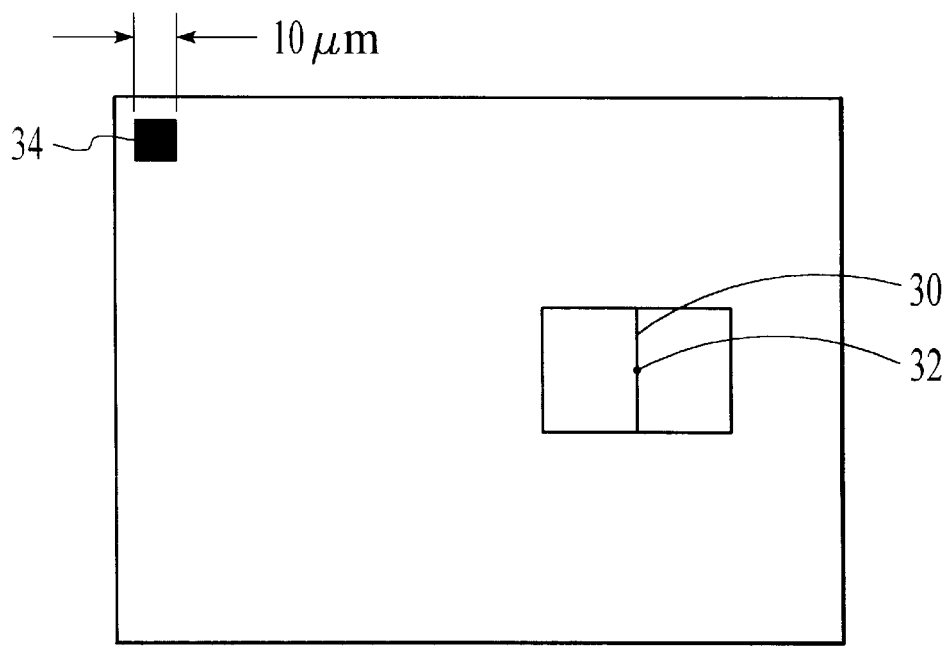
FIG. 2B is a block diagram depicting a plan view of the thinned semiconductor die.

FIG. 2B depicts a plan view of the thinned semiconductor die 20. The semiconductor die 20 also includes at least one attribute 34 on the back side 25. Features 30 and 32 within the active area 22 are also shown. Features 30 and 32 may be viewed using an infrared microscope.

Figure 2C:
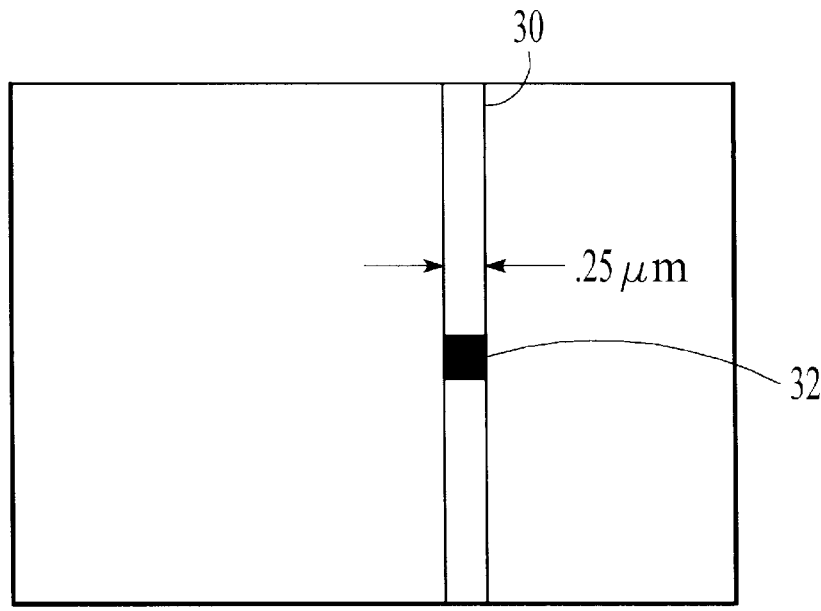
FIG. 2C is a block diagram depicting a close up view of a portion of the thinned semiconductor die.

FIG. 2C depicts a close of view of the features 30 and 32 within the active area 22. Feature 30 is shown as being a line, such as an interconnect. The interconnect 30, as well as other structures fabricated within the active area, typically has a width on the order of approximately 0.25 micron. Also shown is a fault 32 in the interconnect.

Figure 3A:
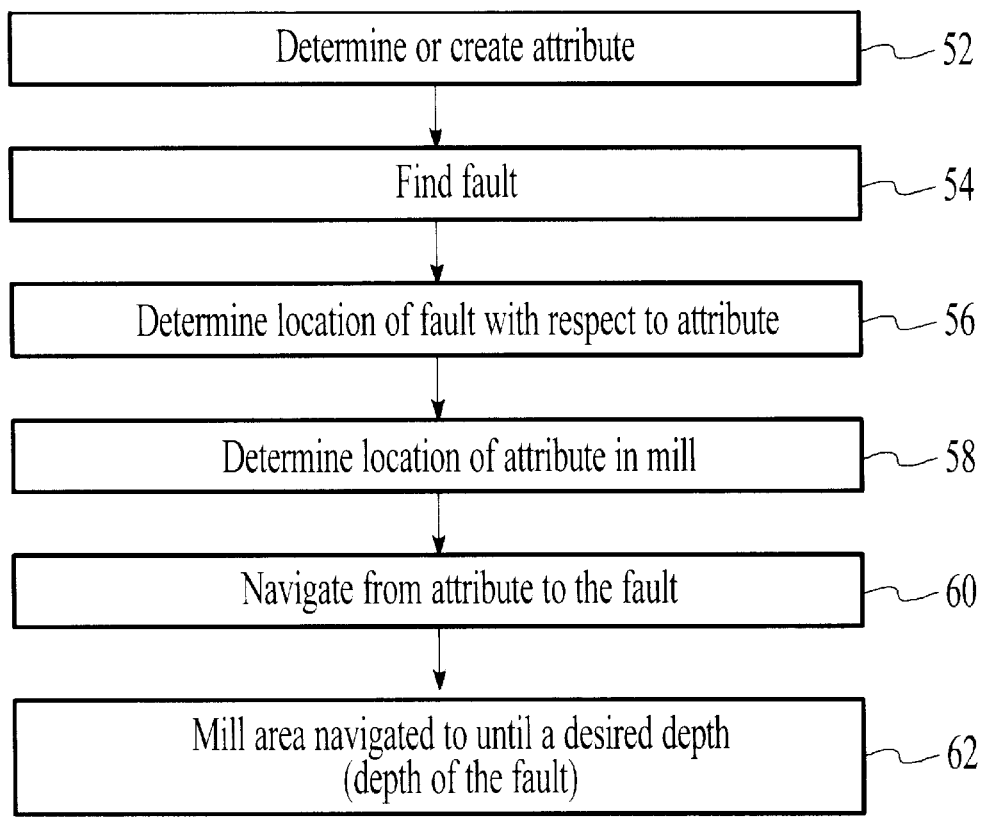
FIG. 3A is a flow chart depicting a conventional method for deprocessing a semiconductor die.

The fault 32 may be of interest. In order to investigate the fault 32, the semiconductor die 30 is further deprocessed after thinning. FIG. 3A depicts a conventional method 50 for deprocessing the semiconductor die 20 that has been thinned. The attribute 34 is first determined or created. The attribute 34 can be preexisting, or can be made by a user, for example by ablating a portion of the back side 25. If the attribute 34 is created, the attribute 34 is typically not well controlled. Thus, the attribute 34 may be very large in comparison to the interconnect 30 or the fault 32. For example, the attribute 34 may be on the order of ten microns. In addition, the attribute 34 may be very deep. The thickness of the remaining inactive area 24 may also be undetermined. In order to prevent creation of the attribute 34 from destroying a portion of the active area 22, the attribute 34 is typically created near the edge of the semiconductor die 20.

The fault 30 that is of interest is found in step 54. Typically, step 54 is accomplished using an infrared microscope, through which a user can look through at least a portion of the inactive area 24. Thus, the fault is initially investigated without destroying the active area 22. The location of the fault 32 is then determined with respect to the attribute, via step 56. This allows the user to locate the fault 32 later. In order to further deprocess the semiconductor die 20, the portion of the semiconductor die 20 between the back side 25 and the fault 32 is removed. To do so, an ion mill (not shown) is typically used. The ion mill utilizes an ion beam to mill the semiconductor die. Thus, the semiconductor die 20 is moved from the infrared microscope, to the mill.

Once the semiconductor die 20 is in the mill, the location of the attribute 34 is determined, via step 58. The user then navigates from the attribute to the fault, via step 60. To do so, the user employs the location of the fault with respect to the attribute determined in step 56. The user then mills to the depth of the fault 32, via step 62. Milling to the depth of the fault 32 ensures that the fault 32 is exposed, but not milled away.

Figure 3B:
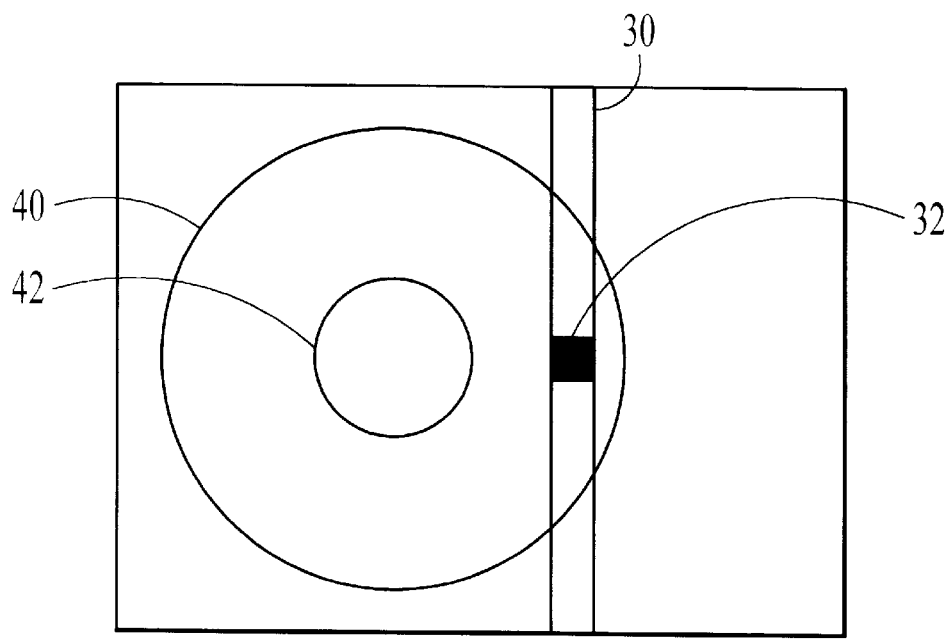
FIG. 3B is a close up view of a portion of the semiconductor die after conventional deprocessing.

Although the conventional method 50 allow a user to deprocess a portion of the semiconductor die 20, one of ordinary skill in the art will recognize that the conventional method 50 may not expose the fault 32. FIG. 3B depicts such a case. The area 40 milled by the ion beam is on the order of the beam spot size. The beam spot may be defined by the intersection of the ion beam and the semiconductor die 20. Typically, the central portion 42 of the area 40 is milled the fastest. Thus, in step 62, the semiconductor die is milled until the central portion 42 should be at the depth of the fault 32. This helps ensure that the fault 32 will not be milled away.

However, the attribute 34 is typically large with respect to the size of the fault 32. In addition, mistakes may easily be made in determining the location of the fault 32 with respect to the attribute 34. Furthermore, mistakes may easily be made in navigating from the attribute 34 to the fault 32 in step 60. Thus, as depicted in FIG. 3B, the central portion 42 of the area 40 being milled may be very far from the fault 32. The user must then repeat the method 50 or estimate the location of the fault 32. Consequently, it may take additional time to expose the fault 32. Moreover, the fault 32 may accidentally be milled away. Even if the fault 32 is not milled away, more milling time is required to expose a fault 32 that is only slightly away from the central portion 42. Consequently, the time required to expose the fault 32 is increased.

One of ordinary skill in the art will also realize that the method 50 is time consuming in addition to being prone to error. The process of navigating from the attribute 34 to the fault 32 may take a relatively long time. Thus, even if a user can navigate to the correct location on the first try, deprocessing the semiconductor die 20 takes a significant amount of time. Moreover, there may be several features at different depths in the semiconductor die 20 or at a different portion of the active area 22 which the user wishes to view. Consequently, deprocessing the semiconductor die 20 is time consuming as well as error prone.

The present invention provides a system and method for deprocessing a semiconductor die. The semiconductor dies has an active area and at least one feature in the active area. The method and system comprise tuning an ablation laser. The method and system further comprise ablating a first portion of the semiconductor die to mark a location of the feature. The first portion is distinct from the active area and has a center. The center of the first portion is substantially above the feature. The method and system also comprise deprocessing a second portion of the semiconductor die using the first portion as a guide. The present invention will be described in terms of a deprocessing to detect a fault and particular features sizes. However, one of ordinary skill in the art will readily recognize that this method and system will operate effectively for deprocessing other types of features and other characteristic sizes. Moreover, the present invention will be described in terms of particular sizes, power levels, and apparatus. However, one of ordinary skill in the art will also recognize that the present invention is consistent with other sizes, power levels, and apparatus.

Figure 4:
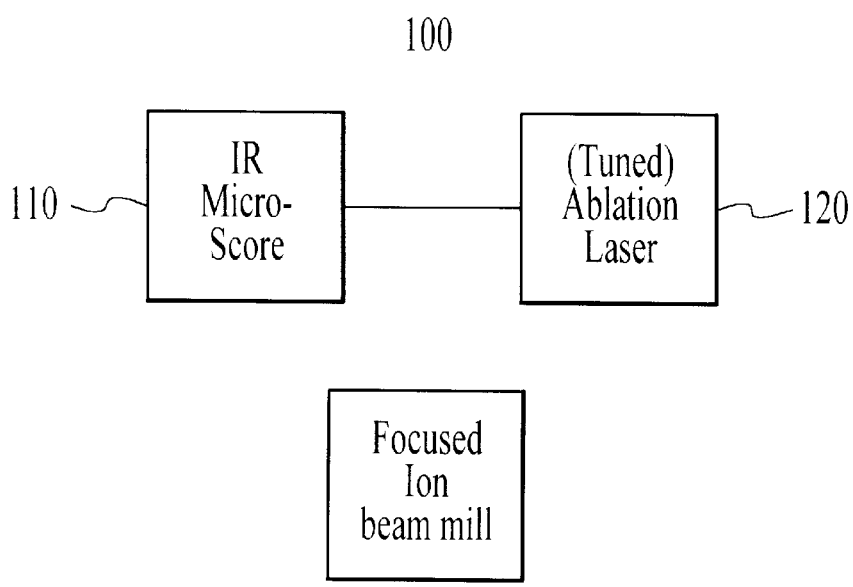
FIG. 4 is a block diagram depicting a system in accordance with the present invention.

To more particularly illustrate the method and system in accordance with the present invention, refer now to FIG. 4 depicting a system 100 for use in accordance with the present invention. The system 100 includes an infrared ("IR") microscope 110, for imaging features in the semiconductor die 20. Coupled with the semiconductor die 20 is an ablation laser 120, for removing a portion of the semiconductor die 20. Preferably, the ablation laser has a tunable power, wavelength of light emitted, and spot size. Also in a preferred embodiment, the minimum spot size is at least as small as one micron. The system 100 also includes a mill 130 for deprocessing the semiconductor die 20. In a preferred embodiment, the mill 130 is a FIB (focused ion beam) mill.

Figure 5:
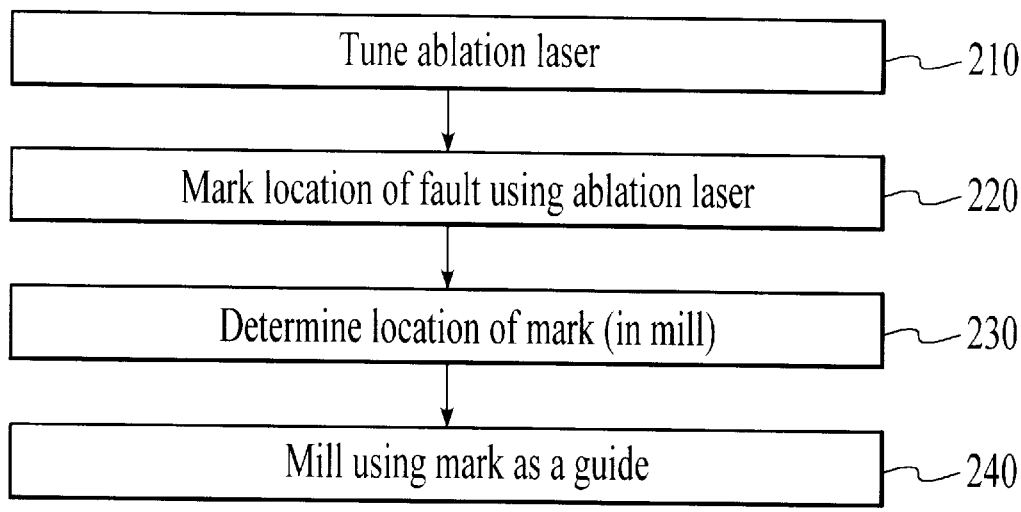
FIG. 5 is a flow chart depicting a method for deprocessing the semiconductor die in accordance with the present invention.

Refer now to FIG. 5, which depicts a flow chart of one embodiment of a method 200 in accordance with the present invention. Preferably, the method 200 commences after the semiconductor die 20 has been thinned and the back side 25 has been exposed. In one embodiment, the method 200 commences after the location of the fault 32 has been determined. Thus, the step of determining the location of the fault 32 is not shown. However, nothing prevents the method 200 from also including a determination of the location of the fault 32 at some time prior to step 220, discussed below.

The ablation laser 120 is tuned via step 210. The location of the fault 32 is then marked on the back side 25 of the semiconductor die 20 using the tuned ablation laser, via step 220. Therefore, step 220 may include aiming the ablation laser 120 at the desired location. Thus, in step 220 a portion of the semiconductor die 20 is ablated away to form a mark. In a preferred embodiment, a central portion of the mark is substantially above the fault 32. However, nothing prevents the mark from being made in another area of the back side 25. The mark made by the ablation laser 120 should be deep enough so that it can be distinguished from surface contamination or other visible portions of the back side 25 which might be mistaken for the mark. In a preferred embodiment, the mark should also be wide enough to be distinguishable prior to milling. However, the mark should not be so large that milling may occur far from the fault 32 being investigated. In addition, the mark should not be so deep as to disturb portions of the active area 22 that may be of interest.

A user then typically desires to mill a region of the semiconductor die 20 near the fault 32. Thus, the semiconductor die 20 is placed in the FIB mill 130. The location of the mark is then determined, via step 230. The semiconductor die 20 is then milled using the mark as a guide, via step 240. In one embodiment, step 240 includes navigating from the location of the mark to the location of the fault. However, in a preferred embodiment, the mark is substantially above the fault 32. Consequently, additional navigation is unnecessary once the mark has been located.

Figure 6:
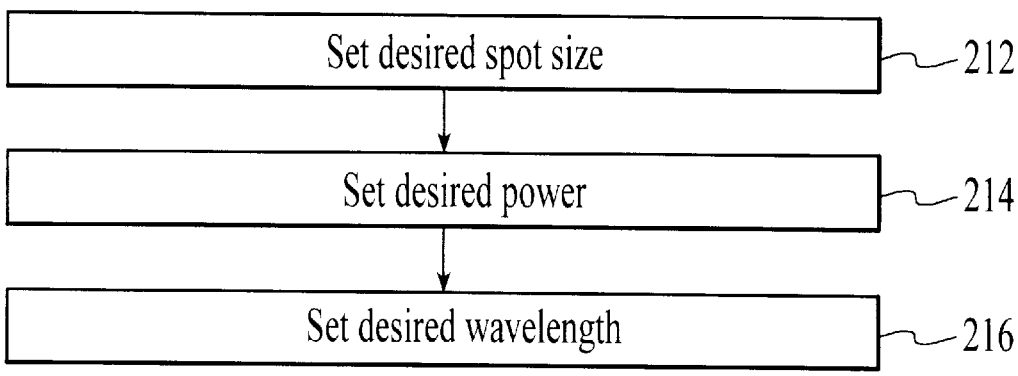
FIG. 6 depicts a method for tuning an ablation laser in accordance with the present invention.

FIG. 6 depicts one embodiment of the step 210 of tuning the ablation laser in accordance with the present invention. If the ablation laser has a variable spot size, the desired spot size is set, via step 212. The spot size is the size of the area of contact between the laser beam from the ablation laser and the back side 25. Preferably, the spot size is on the order of the feature size. However, the spot size should be large enough that the mark can be detected in the FIB mill 130. In one embodiment, the spot size is approximately one micron.

The power of the ablation laser is set to the desired value, via step 214. The wavelength of light in the laser beam may also be set to the desired size, via step 216. In one embodiment, the power is set on the order of 6 watts, and the wavelength is set in the range of green light. In the preferred embodiment, this wavelength and power ensure that the dissipation of energy from the ablation laser 120 and the portion of the semiconductor 20 ablated away do not impact the portion of the active area 22 that is of interest.

In one embodiment, step 210 includes trial and error setting of the desired spot size, power, or wavelength in steps 212, 214, or 216, respectively. In such an embodiment, a user may aim the ablation laser 120 at the edge of the semiconductor die 20, away from the fault 32 of interest. Preferably, the ablation laser 120 is aimed away from any portion of the active area 22 that might be of interest. In a preferred embodiment, the ablation laser 120 is aimed so that the spot is at the edge of the semiconductor die 20. Different combinations of wavelength, power, spot size, and other factors may then be set in steps 212, 214, and 216, respectively. Each time the method 210 is carried out, a sample mark may be made at the edge of the semiconductor die 20. When a mark having suitable characteristics is formed, the tuning step 210 is complete.

Figure 7:
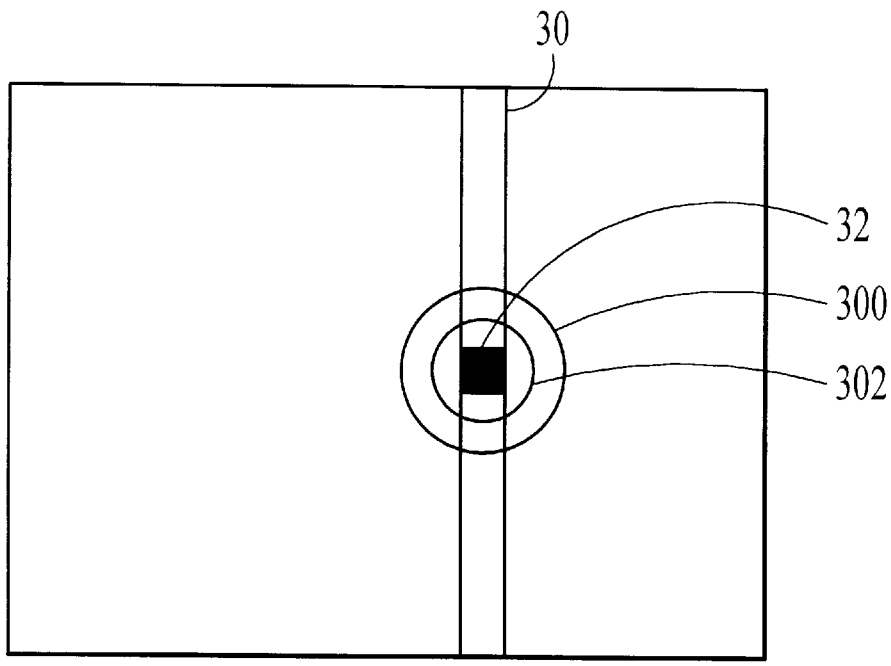
FIG. 7 depicts an area of a semiconductor die which has been marked in accordance with the present invention.

FIG. 7 depicts a close-up view of portion of the semiconductor die 20 which has been marked in accordance with the present invention. The mark 300 is a depression made by the ablation laser 120. The mark 300 is preferably near the fault 32 that is of interest. The mark 300 includes a central portion 302. In a preferred embodiment, the central portion 302 of the mark 300 is substantially above the location of the fault 32. The mark 300 is deep enough so that it can be distinguished from surface contamination or other visible contours of the back side 25 which might be mistaken for the mark 30. However, the mark should not be so deep that portions of the active area 22 that may be of interest are disturbed, for example due to dissipation of laser energy, or destroyed. In a preferred embodiment, the mark 300 is on the order of ten microns in depth. Thus, the mark 300 does not penetrate to the active area 22. In a preferred embodiment, the mark 300 should also be wide enough to be distinguishable prior to milling. However, the mark should not be so large that milling may occur far from the fault 32 being investigated. In a preferred embodiment, the mark 300 is on the order of one micron where the feature size is on the order of 0.25 micron.

Figure 8:
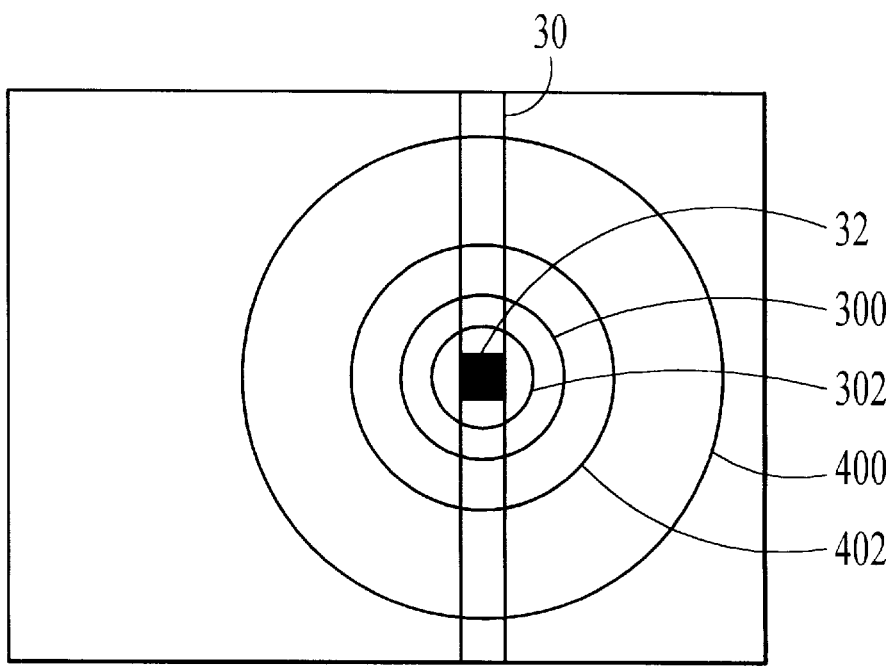
FIG. 8 depicts an area of the semiconductor die which has been marked and deprocessed in accordance with the present invention.

Because the ablation laser 120 is tuned in step 210, the mark 300 formed is easily distinguishable and on the order of the size of the interconnect 30. Consequently, the fault 32 can be found more accurately. FIG. 8 depicts a portion of the semiconductor die 20 after deprocessing in accordance with the present invention. The area 400 is milled by the FIB mill 130. Because of the mark 300, the location of the fault 32 can be more accurately determined for milling. Thus, the central portion 402 of the area 400 being milled may include the fault 32. Therefore, the fault 32 will be exposed during milling. In addition, because the central portion 402 mills more quickly, the fault 32 is exposed in less time.

Because the ablation laser 120 is tuned in step 210, the mark 300 can also be formed so that mark's center 302 is substantially above the fault 32. Thus, the mark 300 can be made above the active area. As a result, navigation to the fault 32 from a distant attribute can be avoided. The time taken for and errors made during navigation are thereby avoided. Consequently, deprocessing is made simpler and faster.

A method and system has been disclosed for more accurately marking the back side of a die for deprocessing. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for deprocessing a semiconductor die having an active area and at least one feature in the active area, the at least one feature having a characteristic size, the method comprising the steps of:

(a) tuning an ablation laser, the step of tuning the ablation laser including the step of setting a desired spot size for the ablation laser, the desired spot size being the characteristic size of the at least one feature;

(b) ablating a first portion of the semiconductor die using the ablation laser to provide a mark for a location of the feature, the first portion being distinct from the active area, the first portion having a center, the center of the first portion being substantially above the feature, the mark having a size based on the desired spot size, the size of the mark being less than or equal to approximately one micron for the at least one feature when the characteristic size is 0.25 micron; and (c) deprocessing a second portion of the semiconductor die using the first portion as a guide.

2. The method of claim 1 wherein the step of tuning the ablation laser (a) further includes the steps of:

(a1) setting a desired power of the ablation laser; and (a2) setting a desired wavelength of the ablation laser.

3. The method of claim 1 wherein the semiconductor die is used in a flip-chip device.

4. The method of claim 1 wherein second portion includes the center of the first portion.

5. The method of claim 1 wherein the first portion further has a diameter of approximately one micron when the feature is on the order of a quarter micron.

6. The method of claim 1 wherein the semiconductor die has a back surface and wherein the first portion further includes a portion of the back surface.

7. The method of claim 1 further comprising the step of:

(e) determining the location of the fault within the semiconductor die.

8. The method of claim 7 wherein location determining step (e) further includes the step of:

(e1) determining the location of the fault within the semiconductor die using infrared light.

9. A system for deprocessing a semiconductor die having an active area and at least one feature in the active area, the feature having a characteristic size the system comprising:

a tuned ablation laser for ablating a first portion of the semiconductor die to provide a mark for a location of the at least one feature, the first portion being distinct from the active area, the first portion having a center, the center of the first portion being substantially above the feature, the tuned ablation laser having a desired spot size set during tuning, the desired spot size being approximately the characteristic size of the at least one feature, the mark having a size based on the desired spot size, the size of the mark being less than or equal to approximately one micron for the at least one feature when the characteristic size is 0.25 micron; and means for deprocessing a second portion of the semiconductor die using the first portion as a guide.

10. The system of claim 9 further comprising means for tuning the ablation laser, wherein the tuning means further includes:

means for setting a desired power of the ablation laser; and means for setting a desired wavelength of the ablation laser.

11. The system of claim 9 wherein the semiconductor die is used in a flip-chip device.

12. The system of claim 9 wherein second portion includes the center of the first portion.

13. The system of claim 9 wherein the first portion further has a diameter of approximately one micron when the feature is on the order of a quarter micron.

14. The system of claim 9 wherein the semiconductor die has a back surface and wherein the first portion further includes a portion of the back surface.

15. The system of claim 9 further comprising:

means for determining the location of the fault within the semiconductor die.

16. The system of claim 15 wherein the determining means further includes:

means for determining the location of the fault within the semiconductor die using infrared light.

* * * * *